United States Patent
Chowdhury et al.

(10) Patent No.: US 7,199,746 B1
(45) Date of Patent: Apr. 3, 2007

(54) METHOD FOR SEARCH AND MATCHING OF CAPACITORS FOR A DIGITAL TO ANALOG CONVERTER OF AN SAR ANALOG TO DIGITAL CONVERTER

(75) Inventors: Golam R. Chowdhury, Austin, TX (US); Douglas Piasecki, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/311,508

(22) Filed: Dec. 19, 2005

(51) Int. Cl.
*H03M 1/12* (2006.01)

(52) U.S. Cl. .................. 341/172; 341/118; 341/120

(58) Field of Classification Search ............... 341/118, 341/120, 172, 155
See application file for complete search history.

(56) References Cited

U.S. PATENT DOCUMENTS

| | | | |
|---|---|---|---|
| 6,600,437 B1 * | 7/2003 | Confalonieri et al. | 341/150 |
| 6,686,865 B2 * | 2/2004 | Confalonieri et al. | 341/172 |
| 6,720,903 B2 * | 4/2004 | Confalonieri et al. | 341/172 |
| 6,882,295 B2 * | 4/2005 | Leung | 341/155 |
| 6,927,723 B2 * | 8/2005 | Nomasaki et al. | 341/172 |
| 6,958,722 B1 * | 10/2005 | Janakiraman et al. | 341/161 |
| 6,985,101 B2 * | 1/2006 | Leung et al. | 341/172 |
| 7,046,178 B2 * | 5/2006 | Draxelmayr | 341/120 |
| 2005/0116845 A1 * | 6/2005 | Lin | 341/118 |

* cited by examiner

*Primary Examiner*—Linh Nguyen
(74) *Attorney, Agent, or Firm*—Howison & Arnott, L.L.P.

(57) ABSTRACT

The method is described for selecting capacitors from a capacitor array for each bit of a SAR ADC. The process involves selecting a group of capacitors from the capacitor array and determining a weight of the selected group of capacitors. A determination is made if the weights of the selected group of capacitors are substantially equal to their desired values. If the weights are substantially equal to their desired values, the selected group of capacitors is associated with each bit of the SAR ADC. If the weights are not substantially equal to their desired values, a next group of capacitors from the capacitor array is selected for the bits. This process of selecting a group of capacitors and determining their weights is repeated until determined weight for a group of capacitors equals or is closest to the desired values.

20 Claims, 12 Drawing Sheets

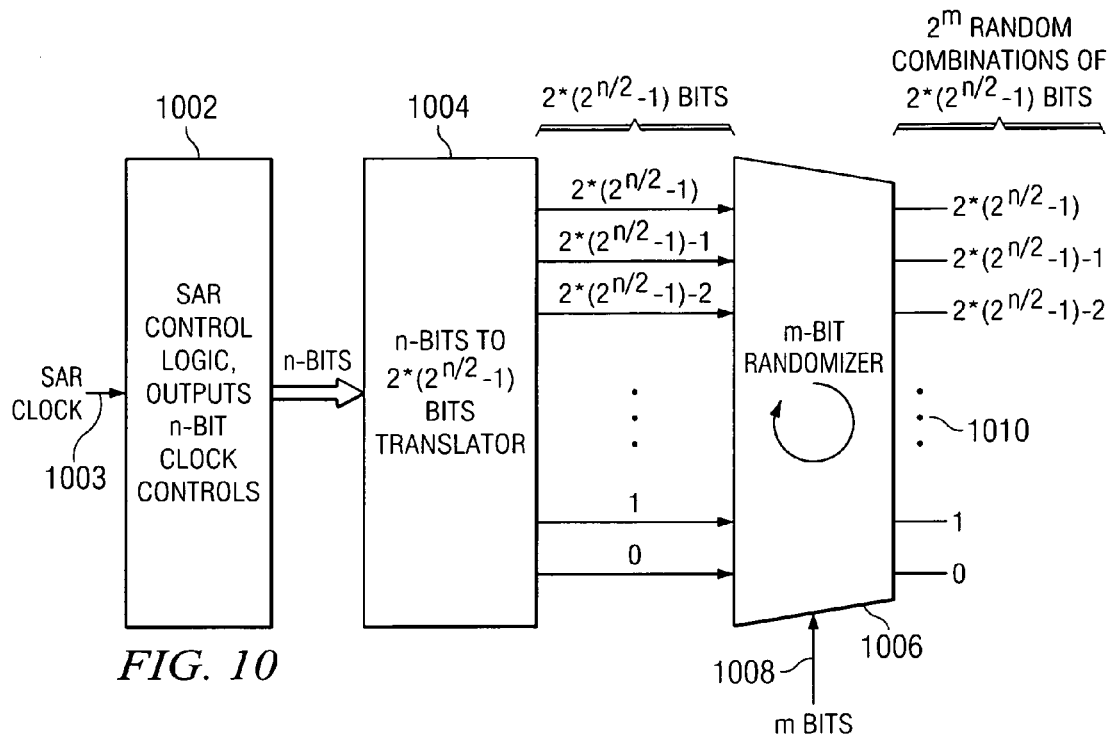
FIG. 10
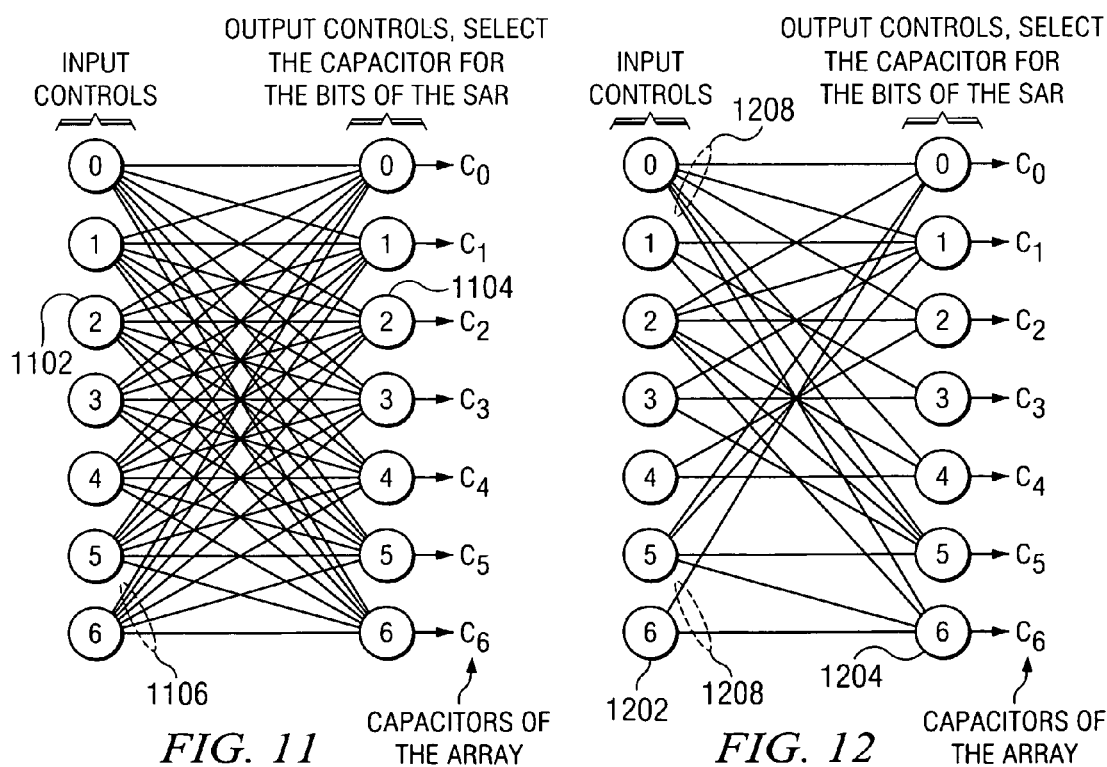
FIG. 11
FIG. 12

METHOD FOR SEARCH AND MATCHING OF CAPACITORS FOR A DIGITAL TO ANALOG CONVERTER OF AN SAR ANALOG TO DIGITAL CONVERTER

TECHNICAL FIELD OF THE INVENTION

The present invention relates to successive approximation registers, and more particularly to the selection of capacitors form capacitor arrays of successive approximation registers.

BACKGROUND OF THE INVENTION

A successive approximation register (SAR) comprises an analog to digital conversion method in which the input voltage is compared with the output voltage of a sequentially programmed digital to analog converter. First, the most significant bit (MSB) of the digital to analog converter is turned on and compared with an analog input voltage. If the input voltage is greater than the digital to analog output, the MSB is left at logic high. Otherwise, the MSB is turned to logic low. This process is repeated for all other bits in decreasing order until the least significant bit (LSB) is reached.

A very popular digital to analog converter architecture used in CMOS technology is the charge scaling DAC. A 10-bit split array binary weighted (binary coded) DAC includes capacitors on both sides of a bridge capacitor that are binary weighted. A capacitance value C is the unit capacitor of any value. This DAC architecture is widely used in charge distribution ADCs. The capacitor array itself is the critical component of the ADC because of the need for precisely/accurately ratioed capacitors. The linearity of the ADC depends on the matching between the ratios of the capacitors associated with the bits of the array. As the number of bits increases, the ratio of the MSB capacitor to the LSB capacitor becomes more difficult to control. The ratio mismatches between the capacitors are greatly reduced by building each capacitor out of the unit capacitor C and by using special layout techniques. Yet there is a great need to further improve the matching of the capacitor ratios, especially with an increase in the number of bits. For ADCs with higher bits (equal to or higher than 10 bits), capacitor calibration techniques are used to achieve better matching between the capacitors. However, this technique would require additional calibration circuits.

Additionally, the comparators used within some types of SAR ADC circuits have large transients applied to their inputs using existing coding techniques. As long as these transients settle down within the time allowed for the comparison by the comparator, this is not a problem. However, for ADCs with higher resolution and speed, the larger transients may place a limitation on the settling times of the input node of the comparator. Thus, there's a need to improve the operation of SAR analog to digital converters within a digital to analog converter with smaller transients for higher resolution comparators and some method for improving the matching between capacitors without requiring any additional calibration circuits.

BRIEF DESCRIPTION OF THE DRAWINGS

For a more complete understanding of the present invention and the advantages thereof, reference is now made to the following description taken in conjunction with the accompanying Drawings in which:

FIG. 5b is a simplified flow chart of the process of FIG. 5a;

FIG. 10 is a functional block diagram of a circuit for randomizing SAR control signals;

FIG. 11 illustrates a 7-bit fully randomized flow chart;

FIG. 12 illustrates a 7-bit partially randomized flow chart; and

SUMMARY OF THE INVENTION

The present invention disclosed and claimed herein, in one aspect thereof, comprises a method for searching and selecting the capacitors for the bits of a SAR ADC. Capacitors or groups of capacitors are selected from an array of capacitors and the weight of the selected capacitors of the bits are determined. A determination is made if the weight of the selected capacitors is substantially equal to a desired value. If the weight of the selected capacitors is substantially equal to the desired value, the selected capacitors are assigned for their associated bits. If the weight of the selected capacitors are not substantially equal to the desired value, a next group of capacitors are selected from the capacitor array. The process of searching and selecting the groups of capacitors and determining their weights is repeated until a group of capacitors is found to be the best fit for the desired values.

DETAILED DESCRIPTION OF THE INVENTION

Figure 1:
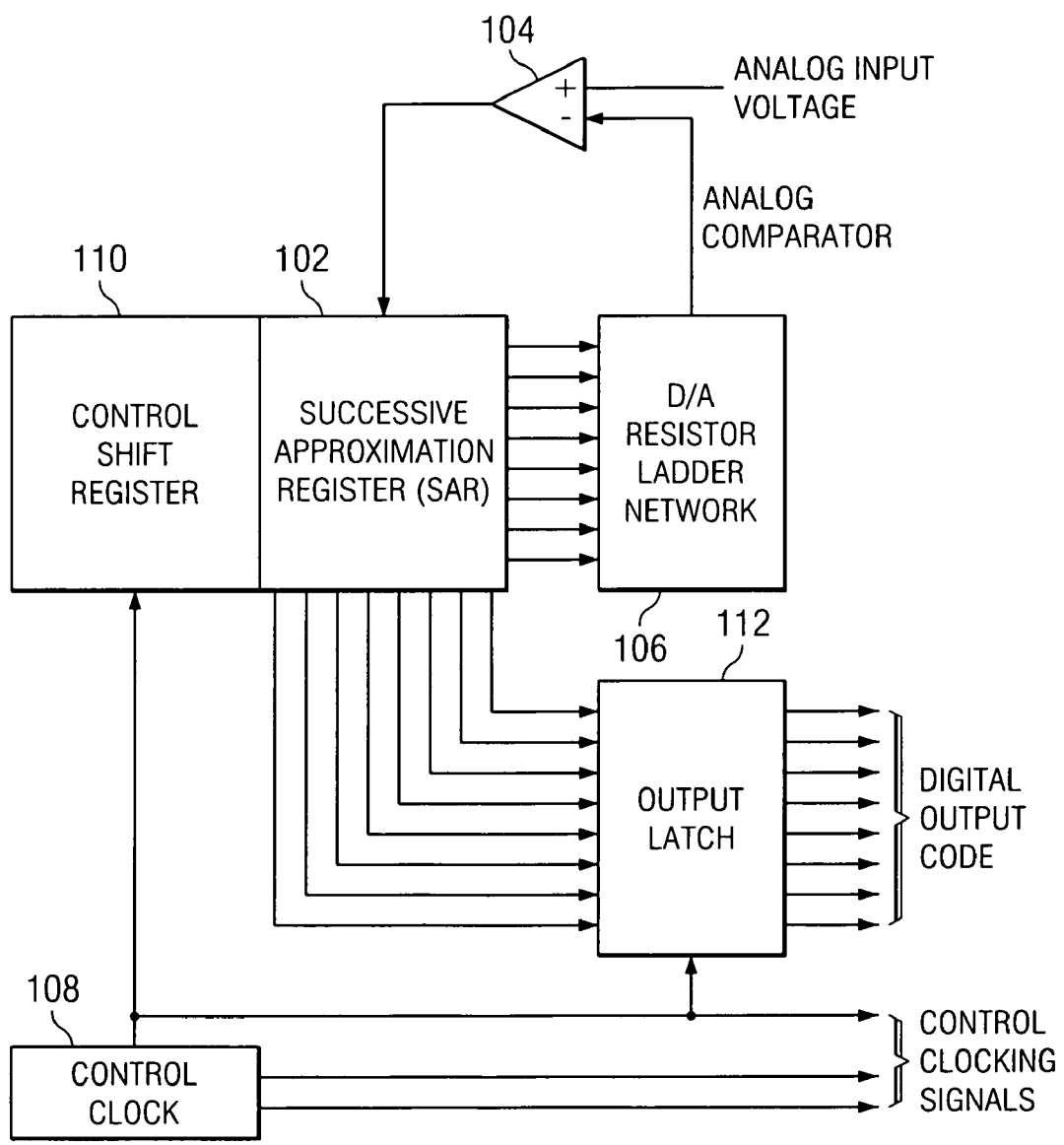
FIG. 1 is a functional block diagram of a successive approximation A/D converter.

Referring now to the drawings, and more particularly to FIG. 1, wherein there is illustrated a functional block diagram of a successive approximation A/D converter. Successive approximation A/D conversion is a technique that is commonly used in medium to high speed data acquisition applications. The successive approximation A/D conversion is one of the fastest A/D conversion techniques that requires a minimum amount of circuitry.

The successive approximation A/D converter can approximate the analog to digital signal to form an n bit digital code in n steps. The successive approximation register 102 individually compares an analog input voltage to the mid point of one of n ranges to determine the value of one bit. This process is repeated a total n times, using n ranges, to determine the n bits of the code. The comparison is accomplished as follows. The SAR 102 determines if the analog input is above or below the midpoint and sets the bit of the digital code accordingly. The SAR 102 assigns the bits beginning with the most significant bit. The bit is set to "1" if the analog input is greater than the midpoint voltage, or it is set at "0" if it is less than the midpoint voltage. The SAR 102 then moves to the next bit and sets it as a "1" or a "0" based on the results of comparing the analog input with a midpoint of the next allowed range. Because the SAR must perform one approximation for each bit in the digital code, an n bit code requires n approximations.

The success of approximation A/D converter as illustrated in FIG. 1 consists of four functional blocks. The SAR 102, the analog comparator 104, a D/A converter 106, and a clock 108. Location to the n bit approximation is controlled by the control shift register 110. The output latch 112 latches in the bits of the digital output code as they are determined by the SAR 102. Analog comparator 104 performs the comparisons of an analog input voltage with the midpoint of the selected one of n ranges presently being examined.

Figure 2:
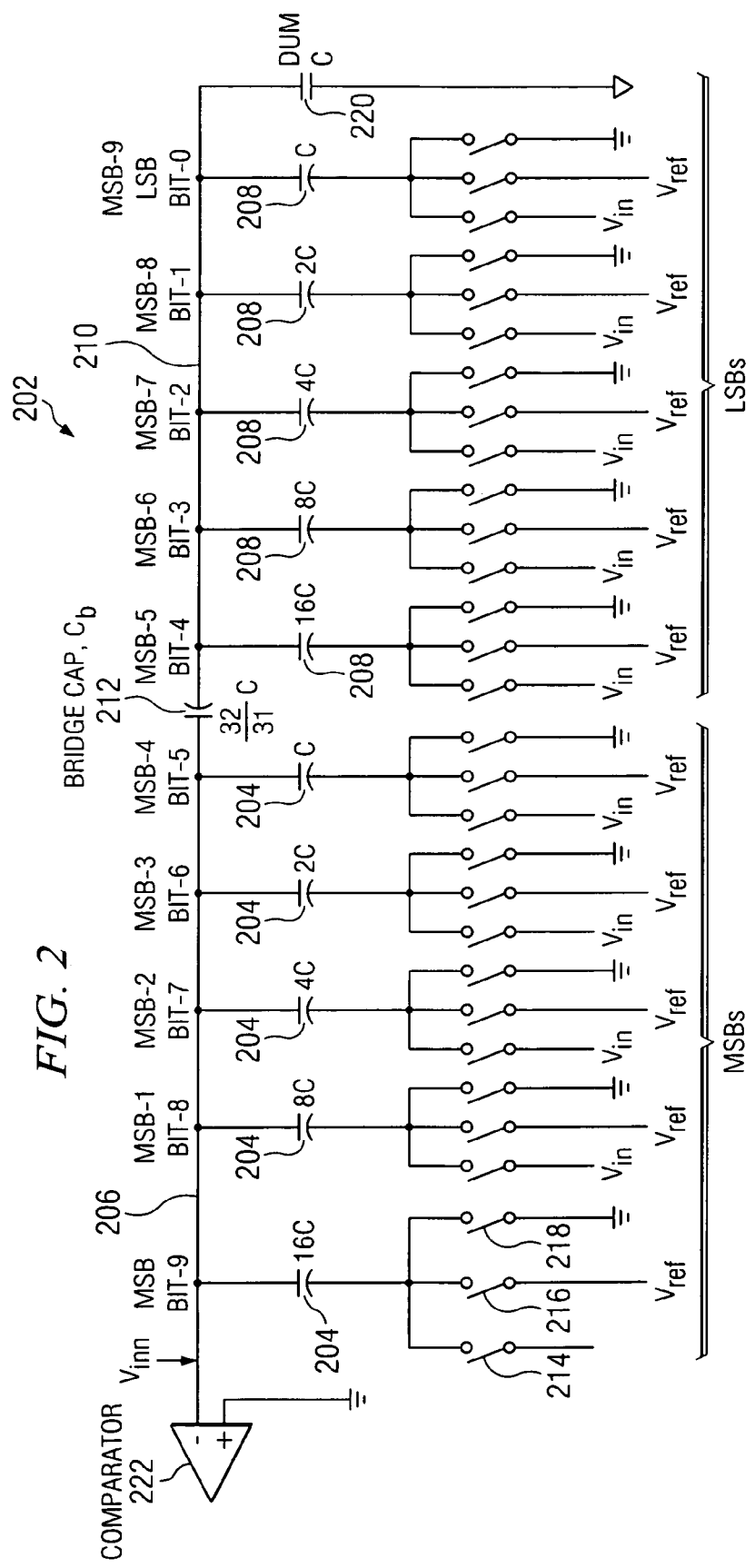
FIG. 2 illustrates a 10 bit split array binary weighted digital to analog converter used within a SAR A/D converter.

Referring now to FIG. 2, there is illustrated a 10 bit split array binary weighted digital to analog converter (DAC). The 10 bit split array binary weighted DAC 202 consists of a group of capacitors 204 connected in parallel wherein a first plate of each capacitor is interconnected at a common node 206, and a second group of capacitors 208 connected in parallel wherein a first plate of each of these capacitors 208 is connected to a second common node 210. The first node 206 and the second node 210 are interconnected via a bridge capacitor 212. The capacitors 204 and 208 are binary weighted capacitors that progressively double in their capacitance from bit 0–bit 4 and from bit 5–bit 9. Thus, the capacitance of bit 0 is C, the capacitance of bit 1 is 2C, the capacitive of bit 2 is 4C and so on until the capacitance of the bit 4 is equal to 16C. There is a similar progression in the capacitance from bit 5 to bit 9. The opposite plates of capacitors 204 or 208 which are not connected with common nodes 206 and 210, respectively, are selectively connected to either of an input voltage $V_{in}$ through switch 214, a reference voltage $V_{ref}$ through switch 216 or ground through a switch 218. The capacitors connected to common node 206 comprise the most significant bits (MSBs) of the DAC 210, and the capacitors connected to the node 210 comprise the least significant bits (LSBs). A dummy capacitor 220 connects between node 210 and ground.

Node 206 is connected to a negative input of comparator 222. The positive input of capacitor 222 is connected to ground or some dc common-mode voltage. A change of logical state of the output of comparator 222 indicates that the bit being tested should be logical "1". If the output of the comparator remains constrained the bit being listed is logical "0." The comparator 222 operates in the following manner. After the sampling is done, all but the MSB capacitors are switched to ground, the MSB capacitor 204 is switched to the reference voltage $V_{ref}$ and the input node of the comparator 222 $V_{inn}$ settles to the following voltage: $V_{inn}=-V_i+0.5*V_{ref}$ where $V_i$ is the analog input voltage (signal). If the input voltage $V_i$ is bigger than the half of the reference voltage $V_{ref}$ then the comparator's output state flips and the decision is made to keep the MSB to the logic high (logic "1") state and its capacitor remains connected to the reference voltage. The next (MSB-1 bit) bit, bit-8, is then tested by switching its caps from ground to the reference voltage. However, if the comparator's 222 output state does not flip at the end of the MSB test, the MSB is set to logic "0", and the MSB-1 bit (bit-8) test proceeds by switching all of the MSB caps from reference to ground, and by switching all MSB-1 caps (8C) from ground to reference voltage.

Figure 3A:
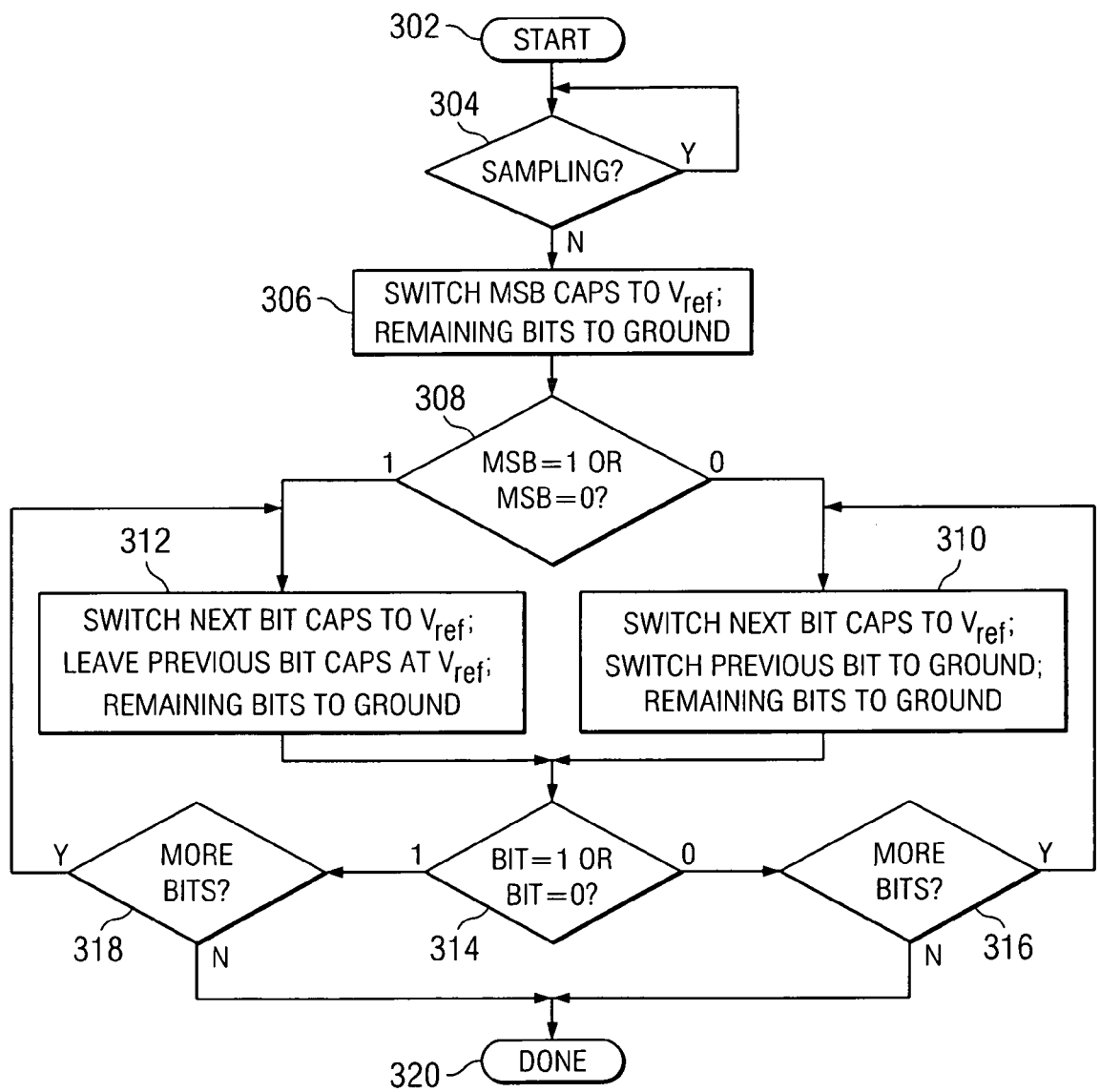
FIGS. 3a and 3b illustrate a flow diagram illustrating the operation of the digital to analog converter of FIG. 2 using a prior art control method.
Figure 3B:
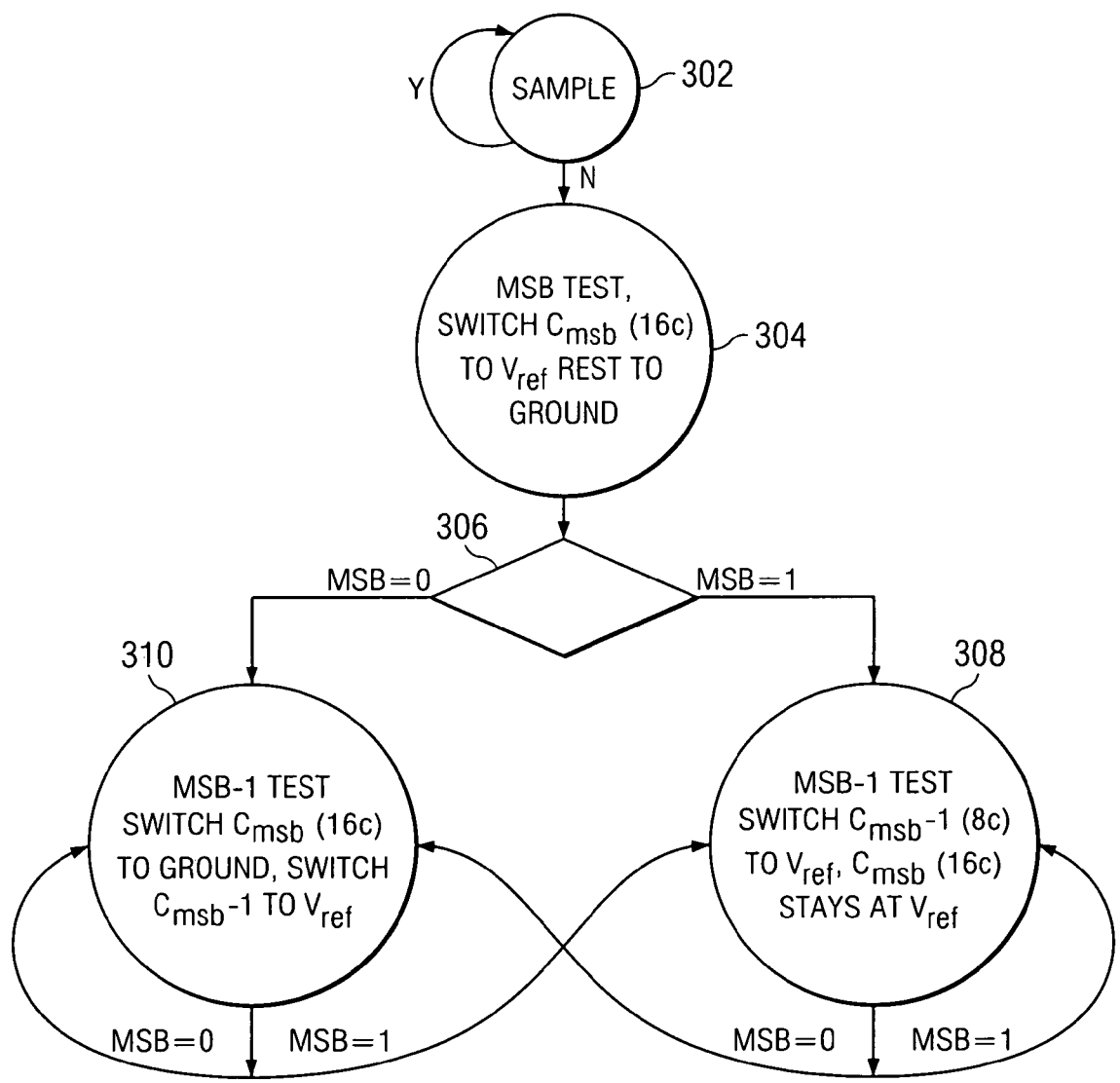

Referring now to FIGS. 3a and 3b, there is illustrated a flow diagram describing the process for selecting the bits within the SAR DAC for a binary coded DAC. The process is initiated at step 302 and inquiry step 304 determines whether the SAR is within a sampling mode. Inquiry step 304 continues to monitor while the SAR is determined to be within the sampling mode. When the SAR switches to the conversion mode, the most significant bit capacitor is switched to the reference voltage $V_{ref}$ at step 306 while the remaining capacitors for the other bits are switched to ground. Inquiry step 308 determines if the most significant bit (MSB) should be set equal to logical "1" or logical "0" depending upon the output of the comparator 222. If the MSB bit is set to logical "0", the capacitors for the next bit are switched to the reference voltage $V_{ref}$ and the capacitors of the previously tested bit are switched to ground at step 310. The capacitors of the remaining bits remain connected to ground. If the MSB bit is set to logical "1", the capacitors of the next bit are switched to the reference voltage $V_{ref}$ while the capacitors of the previous bit remain at the reference voltage at step 312. The capacitors of the remaining bits remain connected to ground.

Once the capacitors of the next bit are switched to the reference voltage at either step 312 or step 310, inquiry step 314 determines whether the newly tested bit should be set to a logical "1" or a logical "0" based upon the output of the comparator 222. If the bit is set to logical "0", control passes to inquiry step 316, which determines whether there are further bits to be tested. If so, control passes back to step 310. Otherwise, the process is completed at step 320. If the tested bit is determined to be set to logical "1" at inquiry step 314, inquiry step 318 determines if there are further bits to be tested, and if so, control passes back to step 312. If no other bits are available for testing, the process is completed at step 320.

When a decision is made to switch a bit being tested back from $V_{ref}$ to ground, a completely new set of unit capacitors must then be tested. There will inevitably be some mismatch between these capacitors. If a bit being tested is set to logical "0", the capacitor being tested is switched back to ground from $V_{ref}$ and the next capacitor to be tested is switched to the reference voltage from ground. These two events occurring at the same time will cause a large transient at the input node of the comparator 222. As long as this transient settles down within the time allowed for making the decision of whether or not to maintain a test bit at a logical high level, then there is no problem. However, for ADCs with higher resolution and speed, this may place a limitation on the settling time of the input node of the comparator 222.

Figure 4:
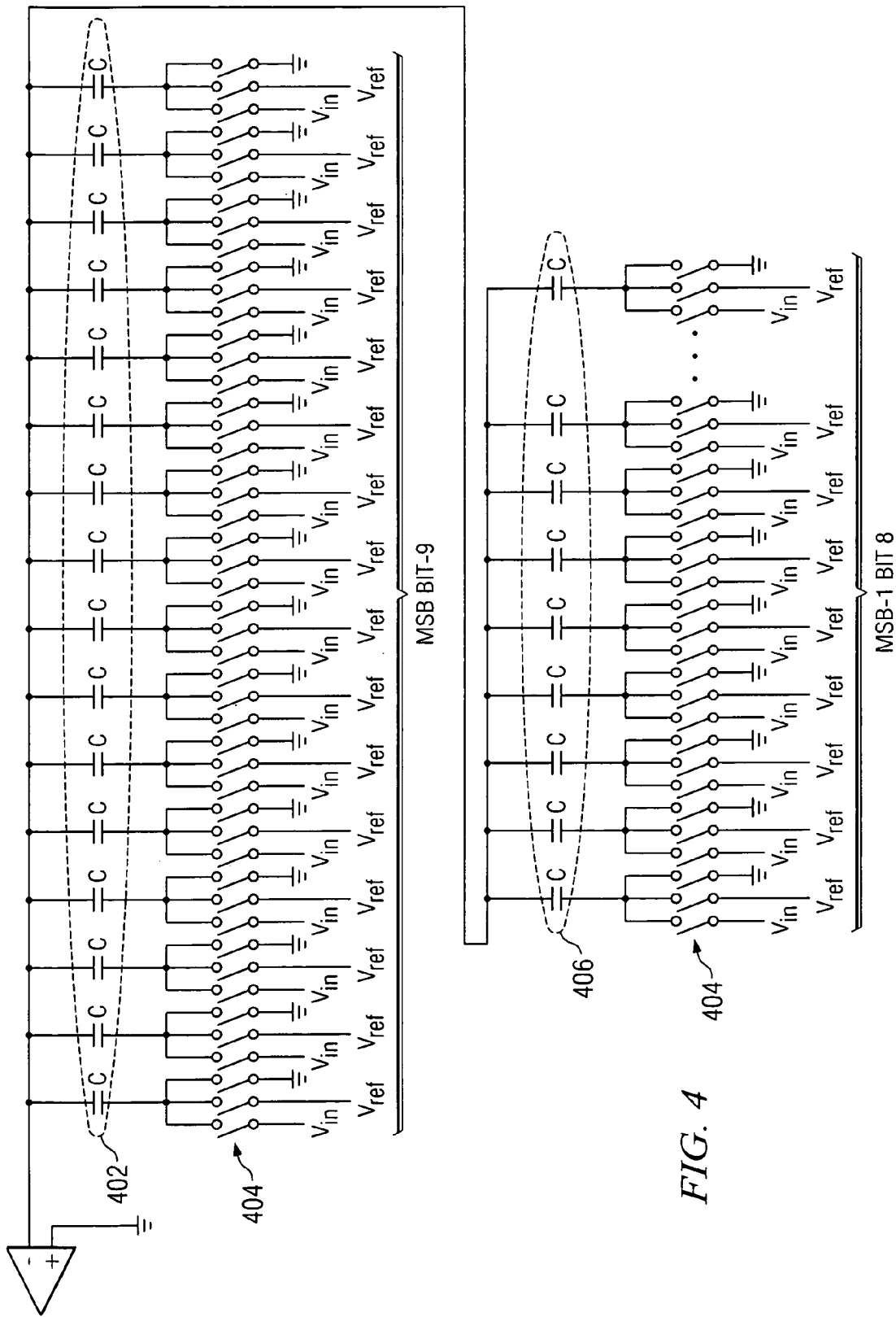
FIG. 4 illustrates the unit capacitors and control switches necessary to operate the first two bits of the digital to analog controller of FIG. 2 according to the control method of the present disclosure.

One manner for combating this problem is more fully illustrated with respect to FIG. 4. One way for overcoming this issue is enabled by using multiple unit capacitors C for each capacitor having a value of multiple unit capacitors C. Thus, rather than having a single capacitor for each of the five most significant bits and each of the five least significant bits within the 10 bit split array binary weighted DAC 202, multiple capacitors are used as illustrated in FIG. 4. Thus, rather than the MSB (bit 9) including a single capacitor 204 having a value of 16C, the MSB would comprise 16 separate capacitors 402 each having a value of C. Each of these capacitors 402 would be connected to a separate switch array 404 including three switches alternately connecting the capacitor 402 to the input voltage $V_{in}$, the reference voltage $V_{ref}$ and ground.

Likewise, the next bit, bit 8, rather than including a single capacitor having a value of 8C would include eight separate capacitors 406. Each of these eight capacitors have a value C, and each of these capacitors are connected to a switching array 404 connecting the capacitor to either the input voltage $V_{in}$, the reference voltage $V_{ref}$ or ground. Likewise, bit-7 of the SAR DAC would include four separate capacitors having a value of C wherein each of the capacitors are connected to a switch array 404. Bit-6 would include two capacitors each having a value of C and each capacitor connected to a switch array 404, and bit-5 would include a single capacitor 204 having a value of C and connected to a switch array 404. The 5-bits (bit-4 thru bit-0) making up the least significant bits would be similarly configured to the MSB bits.

By configuring the capacitors in this fashion, the coding of the SAR DAC 202 may be altered such that testing does not necessarily move to a next most significant bit capacitor when a previous bit's capacitors has been determined to be at a logic low (logic "0") value. In this situation, the capacitors associated with a next bit will remain switched to ground, and half of the unit capacitors of the previously tested bit that are connected to the reference voltage are switched to ground. The remaining half of the capacitors associated with the previously tested bit stay connected to the reference voltage $V_{ref}$. The weight of the capacitor of the presently tested bit is one-half of the weight of the capacitor of the previously tested bit. Thus, the total transient perturbation on the input node of the comparator 222 will be greatly reduced since only a single group of switches are switched, and capacitor matching will be better because half of the capacitors within the previously tested capacitor will be used to decide the state of the next bit. In this case, the voltage at the input node of the comparator will settle to $V_{ipn} = -V_i + 0.25 \times V_{ref}$ assuming the previous bit is to be maintained at logic "0".

Figure 5A:
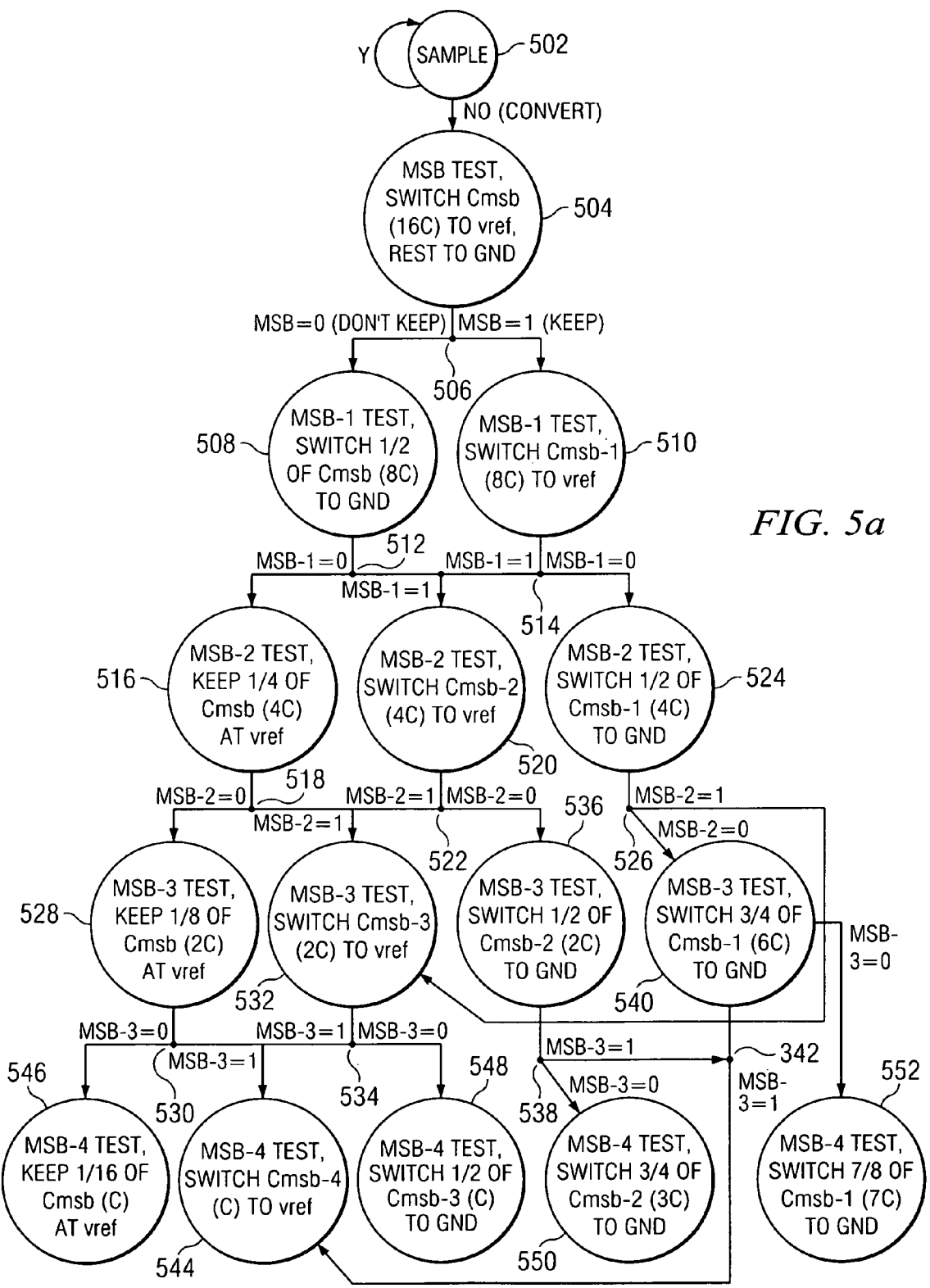
FIG. 5a is a flow diagram illustrating the operation of an SAR ADC on the MSB side using a thermometer coding technique.

Referring now to FIG. 5a, there is illustrated a diagram showing the bit decision making process for the MSB side of a fully thermometer coded 10-bit SAR ADC. This figure illustrates the operation for determining the logical values for bit-9 through bit-5 (the MSB bits). The determination of the logical values for bit-4 through bit-0 will occur in the exact same manner for the least significant bits. Initially, at node 502, a determination is made if the ADC is in a sampling mode or a conversion mode. If the determination is made that the ADC is in the sampling mode, the process continues to monitor until the device enters the conversion mode. When step 502 determines the conversion mode has been entered, control passes to step 504, wherein a test is performed on the MSB bit. To perform the test on the MSB bit, the capacitors for the MSB bit are switched to the reference voltage $V_{ref}$. The capacitors of the remaining bits are switched to ground.

Depending on whether the output state of the comparator changes, a determination is made at node 506 to set the MSB bit to logical "0" or logic "1". If the MSB bit is to be set to logic "0", control passes to step 508 for performance of the test on the MSB-1 bit. The test is performed by switching one half of the capacitors of the MSB bit from $V_{ref}$ to ground. The remaining capacitors of the MSB bit remain connected to the reference voltage $V_{ref}$. The output of the comparator is monitored to determine whether the MSB-1 bit is to be set to logic "0" or logic "1" at inquiry step 512. If the MSB bit is set to logic "1", the MSB-1 test is performed at step 510. In this process the capacitors for the MSB-1 bit are all switched from ground to the reference voltage $V_{ref}$. The capacitors for the MSB bit remain connected to the reference voltage $V_{ref}$ since the MSB bit has been set to logic "1". The output of the comparator is monitored at node 514 to determine whether the MSB-1 bit should be set to logic "1" or logic "0".

Referring now to Step 516, there is described the process for performing a test on the MSB-2 bit, when both the MSB bit and the MSB-1 bit are set to logic "0". If this occurs, the test on the MSB-2 bit is performed by maintaining one-fourth of the capacitors of the MSB bit at the voltage reference $V_{ref}$. Since in this case, one-half of the capacitors of the MSB bit were already connected to $V_{ref}$ for the previous test on the MSB-1 bit only one-half of the remaining connected capacitors must be switched from $V_{ref}$ to ground. The output of the comparator is monitored at node 518 to determine whether the MSB-2 bit should be set to logic "0" or logic "1". If the MSB-1 bit was set equal to logic "1", control passes to step 520. At step 520, the MSB-2 test is performed by switching all of the MSB-2 capacitors from ground to the reference voltage $V_{ref}$. The output of the comparator is monitored at inquiry node 522 to determine whether the MSB-2 bit is to be set to logic "1" or logic "0". If the MSB-1 bit was set to logic "0" after the MSB has been set to logic "1", control passes to step 524. The MSB-2 test is performed at this step by switching half of the capacitors of the MSB-1 bit from the reference voltage $V_{ref}$ to ground. The remaining half of the MSB-1 capacitors are still connected to the reference voltage $V_{ref}$. The output of the comparator is monitored at node 526 to determine if the MSB-2 node should be set to logic "0" or to logic "1".

The decisions made at inquiry nodes 518, 522 and 526 set the stage for determining the value of the MSB-3 bit. If the MSB-2 bit has been set to logic "0" at node 518, the MSB-3 test is performed at step 528. At step 528, the MSB-3 test is performed by keeping one-eighth of the MSB capacitors connected to the reference voltage $V_{ref}$. Since the previous test was performed by connecting only one quarter of the MSB capacitors to $V_{ref}$, the test for the MSB-3 test is performed by maintaining one-eighth of the MSB capacitors at $V_{ref}$ and switching the other one-eighth of the capacitors to ground. Inquiry node 530 is monitored to determine whether to set the MSB-3 bit at logic "0" or logic "1" based upon the output of the comparator. If the MSB-2 bit is set to logic "1" at any of inquiry nodes 518, 522 or 526, the MSB-3 test is performed at step 532. In this test, all of the capacitors for the MSB-3 bit are switched from ground to $V_{ref}$. The output of the comparator is monitored at inquiry step 534 to determine whether the MSB-3 bit is to be set to logic "1" or logic "0". If the MSB-2 bit is set to logic-0 at inquiry node 522, the MSB-3 test is performed at step 536. In this test, one-half of the MSB-2 capacitors are switched to ground and the remaining half of the MSB-2 capacitors stay connected to the reference voltage $V_{ref}$. The output of the comparator is monitored at inquiry node 538 to determine whether to set the MSB-3 bit at logical "0" or logical "1". If the MSB-2 bit were set to logical "0" at node 526, the MSB-3 test is performed at step 540. In this test, three-quarters of the capacitors of the MSB-1 bit are connected to ground and the remaining quarter of the MSB-1 bits connected to the reference voltage $V_{ref}$. Since previously at the MSB-2 test, one-half of the MSB-1 capacitors were connected to ground, this process involves switching only one-quarter of the total MSB-1 capacitors to ground from the reference voltage. Inquiry node 542 monitors the output of the comparator to determine whether the MSB-3 bit is to be set to logical "0" or logical "1".

Based upon the decisions made at inquiry nodes 530, 534, 538 and 542, a test will be performed to determine the logic value of the MSB-4 test. If the MSB-3 bit has been set to logic "1" at any of inquiry steps 530, 534, 538 or 542, the MSB-4 test is performed at step 544. In this step, the capacitors for the MSB-4 bit are all switched from ground to the reference voltage $V_{ref}$. If inquiry step 530 determines that the MSB-3 bit is set to logical "0", the MSB-4 test is performed at step 546. At step 546, one-sixteenth of the capacitors of the MSB bit remain connected to the reference voltage $V_{ref}$. The remaining fifteen-sixteenths of the capacitors of the MSB bit are connected to ground. If inquiry step 534 determines that the MSB-3 bit is equal to logical "0", the MSB-4 test is performed at step 548. In this test, one-half of the capacitors of the MSB-3 bit are connected to ground and the remaining half of the MSB-3 bits connected to the reference voltage $V_{ref}$. If inquiry step 538 determines that the MSB-3 bit is equal to logical "0", the MSB-4 test is performed at step 550. In this test, three-quarters of the MSB-2 capacitors are connected to ground and one-quarter of the MSB-2 capacitors are connected to the reference voltage $V_{ref}$. Finally, if inquiry step 342 determines that the MSB-3 bit is equal to logical "0", the MSB-4 test is performed at step 552. After each of the MSB-4 tests are performed at any of the steps 546, 544, 548, 550 or 552, the output of the comparator is examined to determine whether to set the MSB-4 bit to a logical "1" or logical "0" level.

Once all of the bits have been established on the MSB side of the bridge capacitor 212, the process is repeated on the other side of the bridge capacitor 212 for each of the LSBs. The process on the LSB side starts with the bit that has the highest weight of capacitors (16C for a 10-bit SAR) and all of the bits are decided in the same way as described above in FIG. 5a for the MSB side of the array. This search and decision making method leads to the development of a fully thermometer coded capacitor array on both sides of the bridge capacitor as opposed to a binary weighted array.

Figure 5B:
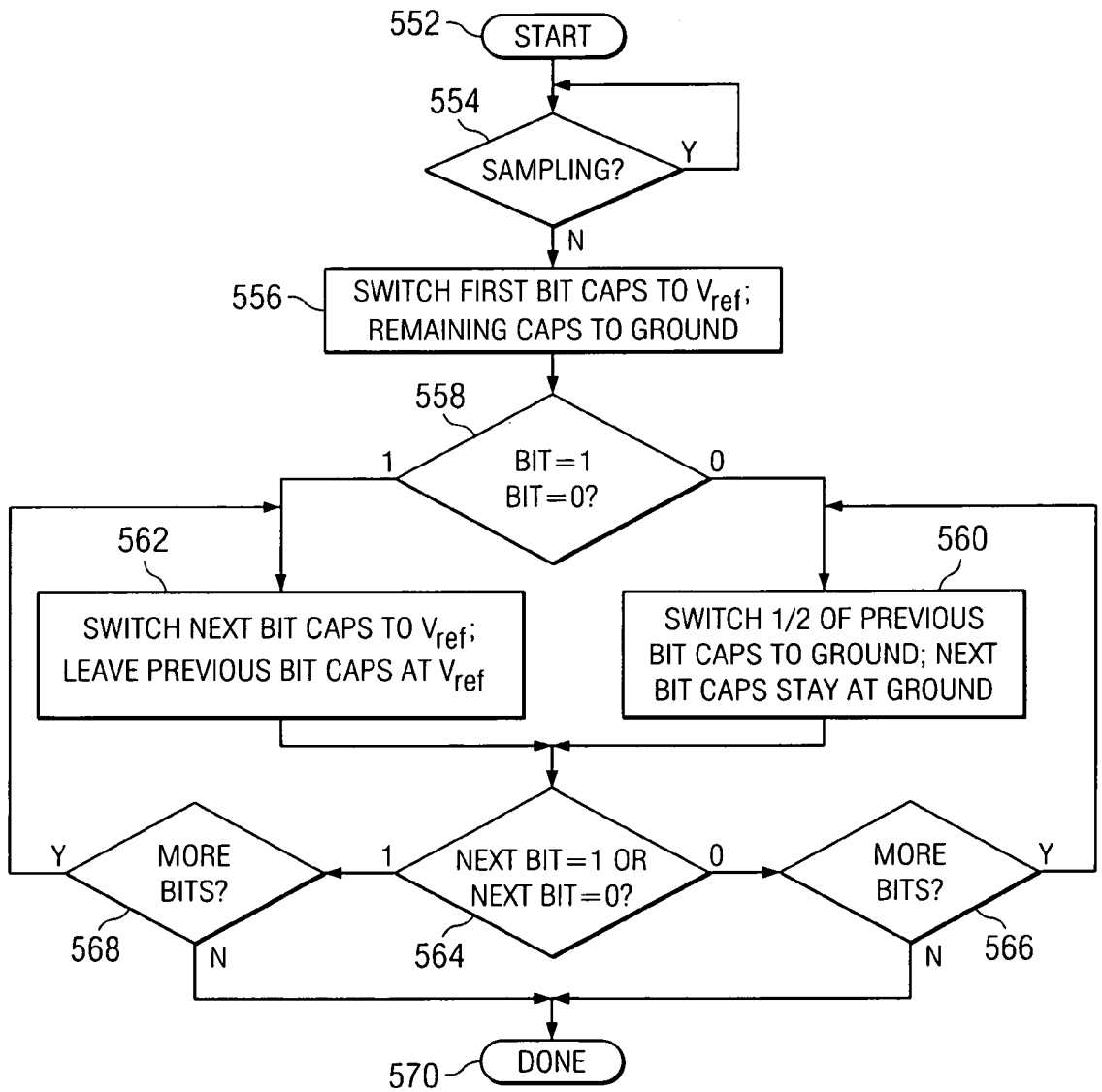

Referring now to FIG. 5b, there is illustrated a flow diagram more simply describing the process illustrated in FIG. 5a for establishing the bits of the thermometer coded SAR. The process is initiated at step 552 and inquiry step 554 determines whether the thermometer coded SAR is presently within a sampling mode. If so, the process continues to monitor at inquiry step 554 until it is determined that the SAR is no longer within the sampling mode and is in a conversion mode. Once the SAR enters the conversion mode, the capacitors of a first bit to be tested are switched to $V_{ref}$ at step 556. The remaining capacitors being tested are connected to ground. Inquiry step 558 determines from the output of the comparator whether the bit being tested should be set to logical "1" or logical "0". If the bit is set to logical "1", the capacitors of the next bit to be tested are switched to the reference voltage $V_{ref}$ and the capacitors of the bit previously tested remain connected to the referenced voltage $V_{ref}$. If the bit is set to logical "0", control passes to step 560 wherein half of the capacitors of the previously tested bit that are presently connected to $V_{ref}$ are switched to ground. The remaining capacitors remain connected to the reference voltage $V_{ref}$. The capacitors of the next bit, whose logical value is actually being determined, remain at ground. Inquiry step 564 determines from the output of the comparator, if the logical value of the next bit should be set to logical "1" or logical "0". If the bit is set to logical "1", control passes to inquiry step 568 to determine if additional bits are available to be tested. If so, control passes back to step 562. If no further bits are available to be tested, the process is completed at step 570. If inquiry step 564 determines that the next bit being tested is set to logical "0", control passes to step 566 to determine if additional bits are available to be tested. If so, control passes to step 560. If no further bits are available to be tested, the process is completed at step 570.

This full thermometer coding technique to decide all of the MSB and LSB bits has one major disadvantage. Each unit capacitor C requires 3 switches attached to it, one for the input signal $V_i$, one for the reference voltage $V_{ref}$ and one for ground. Thus, with every addition of a bit of the SAR, the total number of switches will continue to increase which will require an extensive layout. For example, a 10-bit SAR ADC implemented with full thermometer weighted caps would require a total of 62×3=186 switches. In order to reduce the switch circuitry and to ease the layout, a 10-bit SAR ADC maybe implemented utilizing a combination of binary coded and thermometer coded capacitor arrays. An example of this is illustrated in FIG. 6.

Figure 6:
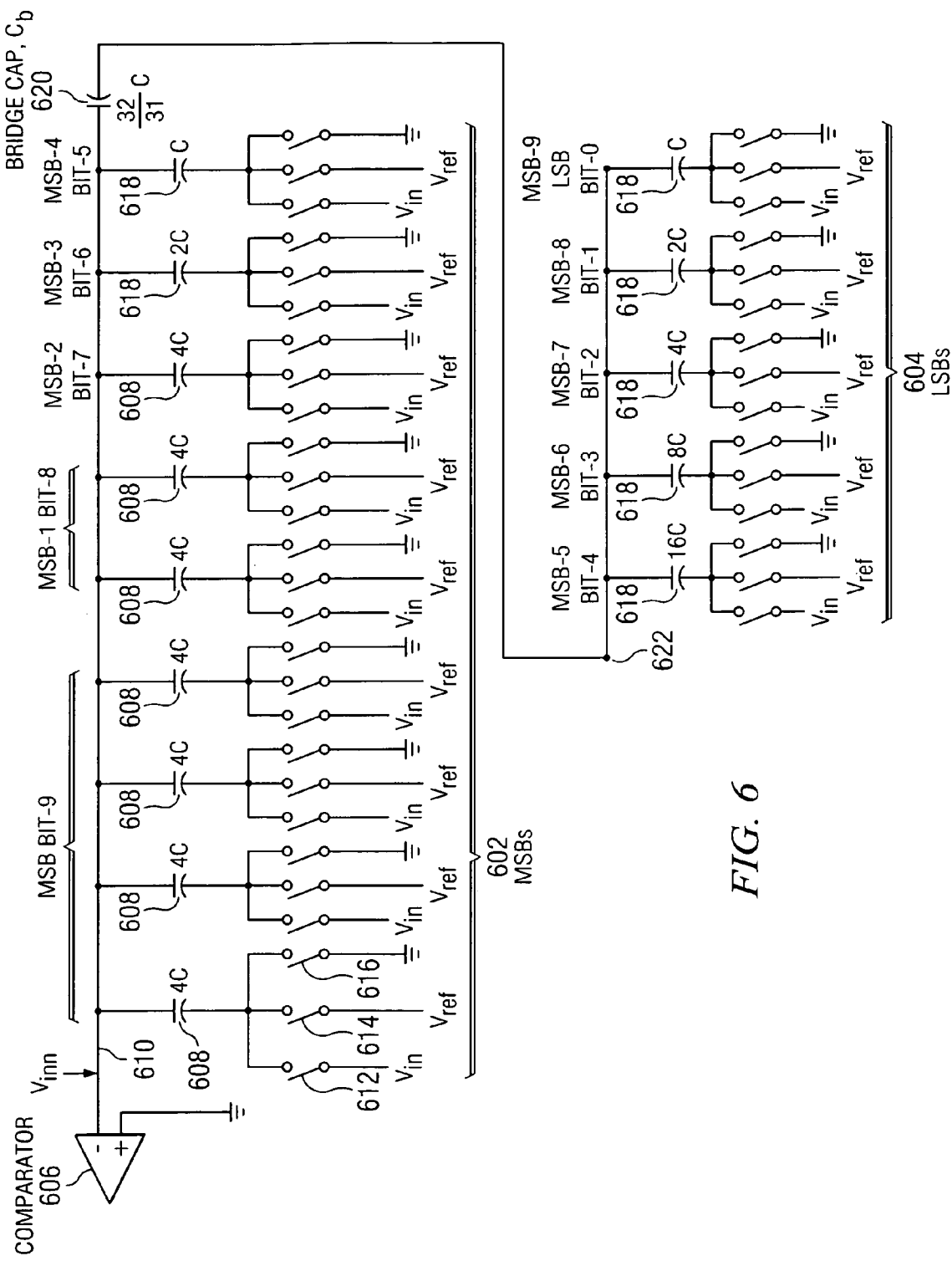
FIG. 6 illustrates a 10 bit split array digital to analog converter wherein a first three most significant bits are thermometer coded and the remaining bits are binary coded.

In FIG. 6, the capacitors for bit-0 through bit-6 are sized in the binary weighted fashion. So, bit-0 to bit-6 require 7×3=21 total switches. However, for the three most significant bits, bit-7, 8 and 9, the capacitors are sized in the thermometer weighted fashion such that a total of 21 switches are needed for the three MSB bits. Thus, for the 10-bit capacitor array a total 42 switches are needed. During the sampling process, all of the capacitors are connected to the input voltage $V_{in}$. At the end of the sampling phase, the SAR decision process begins with the MSB test first with all MSB caps (all 16 unit caps, 4 groups of caps, each group having 4 unit caps) connected to the reference voltage and all other caps connected to ground. The decision making process for the 3-MSBs (bit-9, bit-8 and bit-7) follow the same flow of the fully thermometer coded SAR ADC explained above. The rest of the bits are decided the same way, a binary weighted SAR ADC works. The decision process for the three most significant bits (bit-9, bit-8 and bit-7) is more fully described herein below in FIG. 7.

More particularly referring to FIG. 6, the capacitor arrays for the MSBs 602 and the LSBs 604 are each connected to the negative input of a comparator 606. The positive input of the comparator 606 is connected to ground or to a dc common-mode. The output of the comparator 606 provides the results of each test associated with one of the bits of the code forming the output of the split array DAC. The MSB (bit-9) bit, MSB-1 (bit 8) bit and MSB-2 (bit 7) bit include capacitor groups 608 connected to a common node 610. Each of the capacitor groups 608 are connected to three switches. A first switch 612 connects the capacitor to the input voltage $V_{in}$. A second switch 614 connects the capacitor group 608 to a reference voltage $V_{ref}$ and a third capacitor 616 connects the capacitor group 608 to ground. The remaining bits, bit-6 through bit-0 are configured with binary coded capacitors 618. The binary coded capacitors 618 for bit-6 and bit-5 have a first plate connected to the common node 610 and their other plates connected to the input voltage, reference voltage and ground through switches 612, 614 and 616, respectively. A bridge capacitor 620 interconnects common node 610 to common node 622. The least significant bits 604 are each formed of binary weighted capacitors 618 for bit-4 through bit-0. Each of the least significant bit capacitors have a first plate connected to common node 622, and a second plate connected to one of the input voltage, the reference voltage and ground via switches 612, 614 and 616, respectively.

Figure 7:
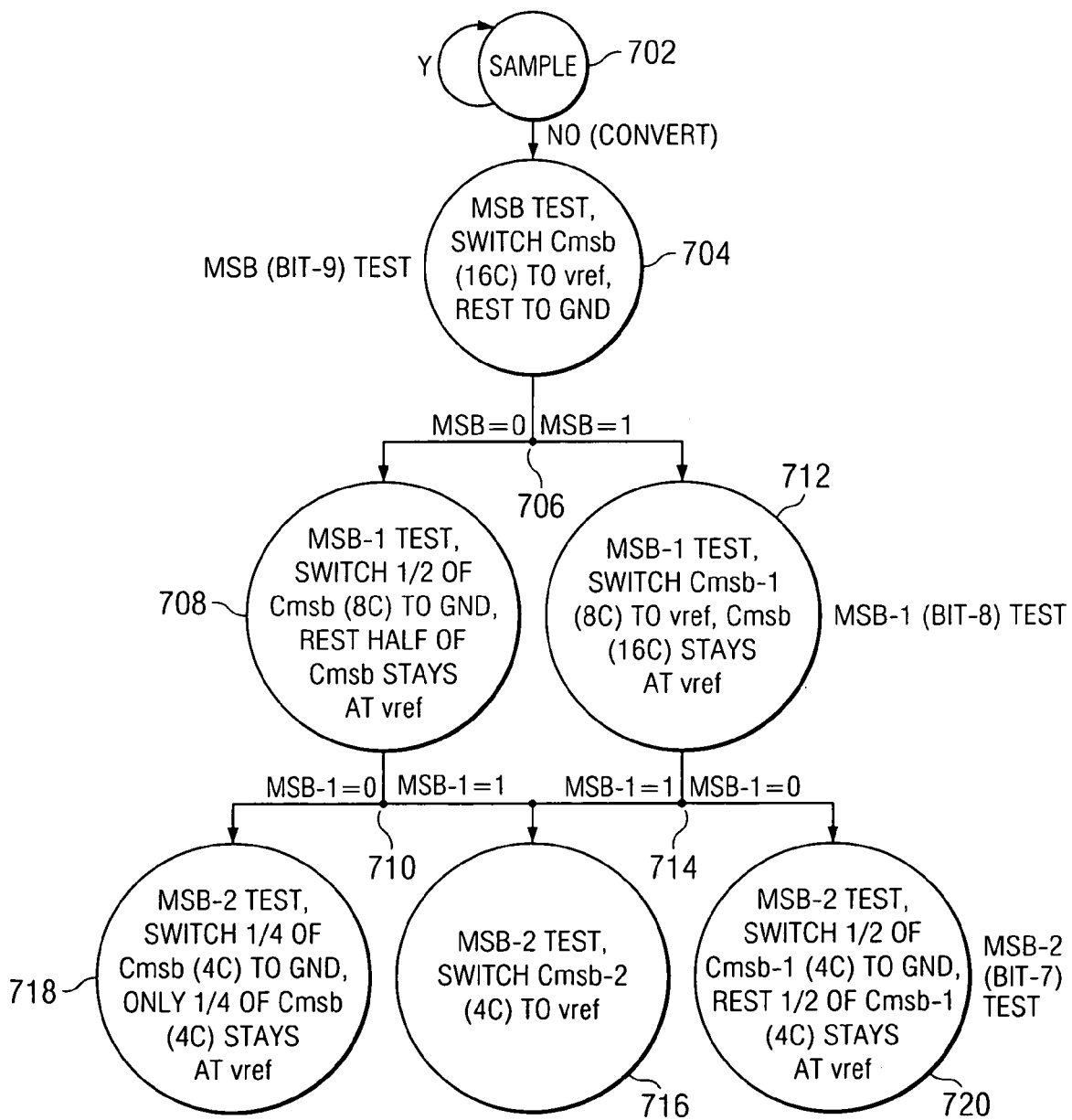
FIG. 7 is a flow chart illustrating the SAR bit decision making process of the three MSBs utilizing fully thermometer coding technique of FIG. 6.

Referring now to FIG. 7, there is illustrated the SAR bit decision process for the three most significant bits, bit-9, bit-8 and bit-7 utilizing a thermometer coding technique. This process is initiated at step 702 wherein a determination is made if the ADC is in the sampling mode or the convert mode. If the device is in the sampling mode, inquiry step 702 continues to monitor until the conversion mode is detected. Once the conversion mode is detected, a most significant bit test is performed on bit-9 at step 704. The capacitors of bit-9 are all switched to the reference voltage $V_{ref}$, while the remaining capacitors in the SAR device are connected to ground. The output of the comparator 606 is monitored to determine if the MSB should be set to logic "0" or logic "1". As described previously, the MSB is set to logic "0" if the state of the output of the comparator does not change states. If the state of the output of the comparator changes, the MSB is set to logic "1".

If the MSB is set to logic "0", control passes to step 708, wherein the MSB-1 test is performed by switching half of the capacitors of the MSB (bit-9) to ground and maintaining the remainder of the MSB capacitors at $V_{ref}$. The output of the comparator 606 is monitored to determine whether the MSB-1 bit should be set to logical "0" or logical "1". If it is determined that the MSB is set to logical "1", step 712 performs the MSB-1 test by switching the capacitors of the MSB-1 bit (bit-8) from ground to $V_{ref}$. Since the MSB was set to logical "1", the capacitors of the MSB remain at $V_{ref}$. The output of the comparator 606 is monitored to determine if the MSB-1 bit should be set to logical "1" or logical "0".

If it is determined at either of inquiry nodes 710 or 714, that the MSB-1 bit is set to logical "1", control passes to step 716, and the MSB-2 test is performed by switching the capacitors of the MSB-2 bit (bit-7) from ground to the reference voltage $V_{ref}$. If the MSB-1 bit (bit-8) is set to logic "0" at node 710, step 718 performs the MSB-2 test by switching one-fourth of the capacitors of the MSB bit (bit-9) to ground. Thus, only one-fourth of the capacitors of the MSB remain at the reference voltage $V_{ref}$. Finally, if the MSB-1 (bit-8) is set to 0 at node 714, the MSB-2 test is performed at step 720. For the this test, one-half of the capacitors of the MSB-1 bit (bit-8) are switched to ground and the remaining half of the capacitors stay connected to the reference voltage $V_{ref}$. No matter which of the tests at step 718, step 716 or step 720 are performed, the output of the comparator 606 is monitored to determine the value of bit-7. Once a logical value has been assigned to bit 7, the remainder of bits 6 through bits 0 are assigned using the binary weighted coding technique as described previously herein.

An n-bit SAR analog to digital converter, requires only n-clock cycles to complete all n conversions. Each bit is tested with a control signal, having a time period equal to 1:00. Each test bit issues to a switch of a capacitor associated with the bit under test. In the partial binary partial thermometer coded SAR ADC implementation illustrated in FIG. 6, there are fourteen total capacitors to test. And only ten control cycles or control bits are available. Seven least significant control bits (bit-0 through bit-6) are used to decide the bits 0–6. The upper three MSB control bits are translated to generate 7 thermometer coded control bits to use for the seven thermometer weighted capacitors to decide the upper three MSB bits 9–7. Thus, this implementation first iterates the first SAR control signals, the lowest of them are used straight to test the lower SAR bits and the upper three SAR control signals are translated to generate seven thermometer control weighted signals for the seven thermometer weighted caps for the three most significant bits 9–7. Using the above-described system, the transient issues described hereinabove, would be significantly reduced as on many occasions only a single switch is being operated with respect to each particular decision rather than two sets of switching events generating transients to the input of the comparators. Also better matching between the capacitors will be achieved, as many a time part of the previously tested capacitors will be used to test the next bit.

Figure 8:
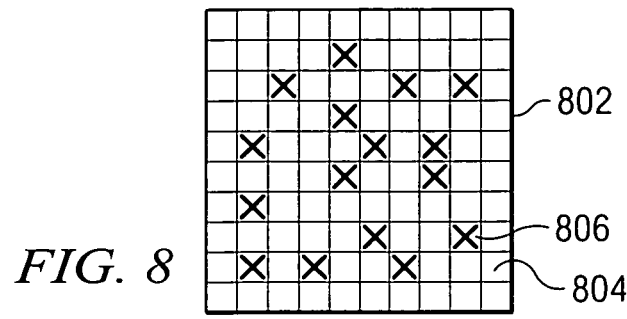
FIG. 8 illustrates a capacitor array.

Referring now to FIG. 8, there is illustrated a capacitor array 802. The capacitor array 802 consists of an X×Y array of capacitors, each of the blocks 804 represent a unit capacitor which may be used in creating the thermometer coded capacitors in the capacitor arrays of the successive approximation registers described in each of FIGS. 2 and 6. While an X×Y array has been described, the size of the array may be any configuration. While attempts are made to design the capacitor array 802, such that each of the unit capacitor 804 are equally sized, certain manufacturing informalities may cause there to be slight differences between certain unit capacitors 804. The matching between the ratios of the capacitors of the bits of the SAR ADC is very important to guarantee good linearity of the ADC. Thus, an improved technique for selecting capacitors associated with the bits is described herein. During the design of the SAR ADC a fixed set of unit capacitors may not be allocated to make up the bits of the SAR. Rather this technique provides an option to select the best set of capacitors for the bits from the capacitor array 802.

Figure 9:
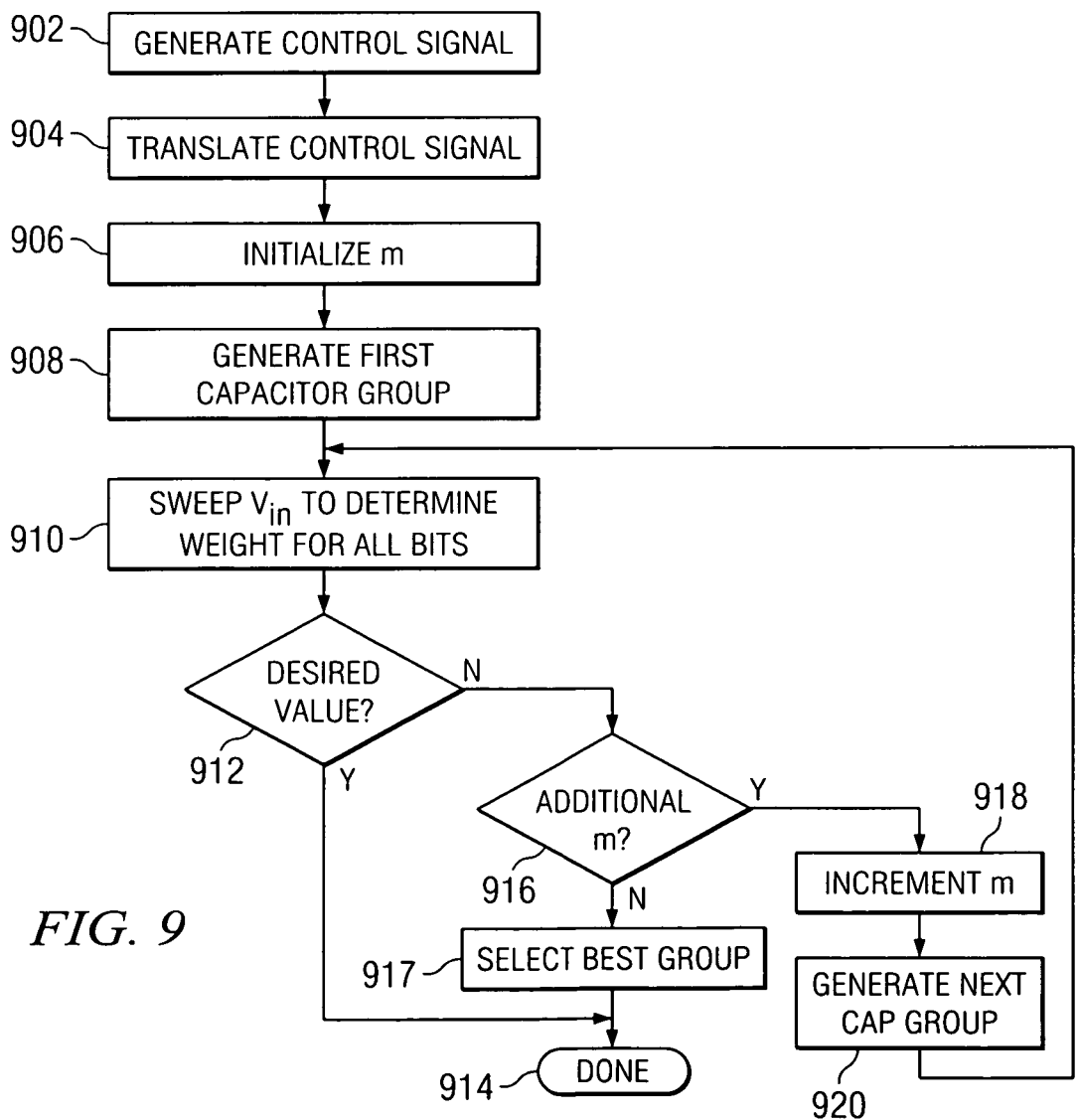
FIG. 9 is a flow diagram illustrating the process for selecting capacitors from a capacitor array for a SAR ADC.

Referring now FIG. 9, there is illustrated a flow diagram describing the process for searching for the best matched group of capacitors for all bits of a successive approximation register ADC from the capacitor array 802. The described process does not require the use of any additional calibration circuits with the SAR ADC. The selection of capacitors is performed in a calibration process.

Referring now to FIG. 9, there is illustrated a method for searching and finding the best possible matched capacitors for the bits of a successive approximation register analog to digital controller during a calibration process. Initially at step 902, the control logic for the SAR generates a control signal. The control signal is translated from n-bits to $2*(2^{n/2}-1)$ bits at step 904. The number of $2*(2^{n/2}-1)$ equals the total number unit capacitors for an n-bit SAR ADC as shown in the array of FIG. 8. Also the number $2*(2^{n/2}-1)$ equals the total number of switches needed for a fully thermometer coded SAR ADC to switch the bottom plates of the capacitors to the reference voltage during the SAR conversion. The value for the number m of randomized configurations of the capacitors that may be generated is initialized at step 906. Using the initialized value for m and the control signal having $2*(2^{n/2}-1)$ bits, capacitors for all the bits are selected at step 908. A test is then performed for all bits using the selected capacitors to determine the weight of each bit. The weight of each bit depends on the capacitors selected for the bit. The weight of a bit is determined by varying the input voltage $V_{in}$ for a fixed reference voltage $V_{ref}$ to find out the code for the bit. For example, for a 10-bit SAR the codes for the bits from MSB to LSB are 512, 256, 128, 64, 32, 16, 8, 4, 2, 1. When the code corresponding to a bit is found, at that point the ratio between $V_{in}$ to $V_{ref}$ gives the weight of that bit. Thus for a particular value of m the weights of all the bits are determined and compared to their expected values. This is done at inquiry step 912 which determines whether the determined weight for the selected capacitors for all bits are substantially equal to their desired values and if so, the process is completed at step 914. Otherwise, control passes to step 916 to determine if additional values of the m control bit exists. If not, then the capacitors having the weights closest to the desired value are selected at step 917, and the process is completed at step 914. If additional values exist, m is incremented at step 918 and the next selection of capacitors for all the bits is made at step 920. Control then passes back to step 910 to again determine the weights of the SAR bits in terms of the capacitors selected. These steps are repeated for each value of m and for each value of m a different set of capacitors are selected for each bit from the same capacitor array 802 of FIG. 8.

In a SAR ADC, the weights of the MSB through the LSB capacitors with respect to the full capacitor array are one-half, one-quarter, one-eighth, one-sixteenth . . . $½^n$, respectively. In the capacitor array, each bit capacitor is built of unit capacitors and with special matching techniques applied during the layout process, there still exists some errors in the unit capacitors which will make the actual weights of the capacitors relative to the full array associated with each bit different from their expected ideal value. Any deviation of the actual bit capacitor value from their expected ideal value introduces a non-linearity into the SAR ADC.

The search and find technique described with respect to FIG. 9, determines the best possible set of unit capacitors to make the capacitors for all bits which will provide the best possible weights for the capacitors of each bit. Thus, this technique does not require the capacitor array to be binary weighted but, instead works best for the thermometer weighted capacitor array described above.

In an n-bit binary weighted SAR ADC, n-control signals are needed to test n-bits. In the split array fully thermometer coded SAR capacitor array, each side of the bridge capacitor requires $2^{n/2}-1$ control signals to test all of the bits. Thus, the array needs a total of $2*(2^{n/2}-1)$ control signals to test all of the bits on both sides of the array. The described search technique requires an additional m-bit muxing or switching circuit to randomize the $2*(2^{n/2}-1)$ control bits to create $2^m$ possible random combinations of the $2*(2^{n/2}-1)$ bits.

This randomized technique works differently from the straight conventional SAR technique. In the straight conventional SAR technique, the $n^{th}$ control signal is always used to test the $n^{th}$ bit where the capacitors for the $n^{th}$ bit are fixed. However, in the present technique, the capacitors of the $n^{th}$ bit, and all other bits as well, are selected from the capacitor array of FIG. 8. Thus, the m-bits are used to search and find the best possible matched capacitors for the bits from the capacitor array. For an m-bit randomizer a total of $2^m$ number of possible random selections can be made to select the best possible matched capacitors from the capacitor array 802 of FIG. 8. This is more fully illustrated in FIG. 11. FIG. 11 illustrates a 7-bit fully randomized circuit. While only a 7-bit circuit is described, a circuit of any number of bits may be used. Seven different input control bits 1102 may be fully randomized to any of seven different output bit positions 1104. The output bits are used during the SAR conversion to drive the bottom plates of the capacitors to the reference voltage to test the bits of the SAR ADC. Typically SAR conversion starts with the MSB bit test first, bit 6 in the present example. The capacitors of the array. $C_0$ to $C_6$ are usually made up of multiple unit capacitors. In a conventional SAR conversion, the MSB control bit 6 is always used for the capacitor $C_6$, thus the capacitor $C_6$ is the fixed capacitor for the MSB. But according to the design based upon the disclosure in FIG. 11, the MSB control bit 6 may be randomized to any of the positions from output control bit 0 to output control bit 6 along seven different pathways 1106. This way the MSB control bit 6 can be used for any of the capacitors $C_0$ to $C_6$ of the array. This means any of the capacitors $C_0$ to $C_6$ from the array can be selected for the MSB bit. The same is true for all other bits as the remaining input controls may be randomized in a similar manner. The n-bit fully randomized circuit requires n×n controllable switches or muxes in order to implement the circuit. The amount of circuitry grows impractically large for large values of n for a completely randomized application.

Thus, to ease the implementation, a partially randomized circuit may be used as shown in FIG. 12. FIG. 12 illustrates a flow chart for a partially randomized circuit, wherein seven input bits 1202 may only go to certain ones of a number of output bits 1204. As before, while a 7-bit circuit is illustrated, a circuit of any number of bits may be used. Thus, input control bit 0 may go to any of output control bits 0, 1, 2, 4, 5 or 6. Likewise, input control bit 1 may go to any of output control bits 1, 3 or 4. The pathways 1208 within FIG. 12 illustrate the various select pathways which may go from one input control bit signal to one output control bit. While the description with respect to FIG. 12 illustrates particular input control bits going to select ones of the output control bits 1204, it should be noted that in the partial randomization process, a particular input control bit can go to any selected output control bit according to a designed randomization circuit. The use of the randomly selected output bits from the particular input control bits may be designed in any practical fashion.

The randomization technique described hereinabove, may be implemented using a system such as that illustrated in the functional block diagram of FIG. 10. FIG. 10 illustrates the m-bit muxing or switching circuit needed to randomize the $2*(2^{n/2}-1)$ control bits to generate $2^m$ possible random combinations of the $2*(2^{n/2}-1)$ control bits. The SAR control logic 1002 generates n-bit control signals responsive to the SAR clock input 1003. The n-bit control signal is provided to a $2*(2^{n/2}-1)$ bit translator 1004 which translates the n-control bits into $2*(2^{n/2}-1)$ control bits. In a conventional SAR ADC, the $2*(2^{n/2-1})$ bits would be provided to the SAR ADC to determine the output bits. According to the present disclosure, the $2*(2^{n/2}-1)$ controls bits are provided to an m-bit randomizer 1006 along with an additional m-bit control signal 1008. The m-bit randomizer 1006 takes the $2*(2^{n/2}-1)$ control bits and provides $2^m$ combinations of randomly positioned $2*(2^{n/2}-1)$ output control bits responsive to the m-bits provided on input 1008. Thus, for example if m=3, a possibility of eight combinations of the $2*(2^{n/2}-1)$ bits may be provided on the output control bits 1010. The m-bit randomizer 1006 may generate as many or as few outputs as defined by the control bits m. Each of the combinations of the $2*(2^{n/2}-1)$ bits may be tested as described in FIG. 9 to determine the best group of unit capacitors to use for each bit positioned within the capacitor array.

Figure 13:
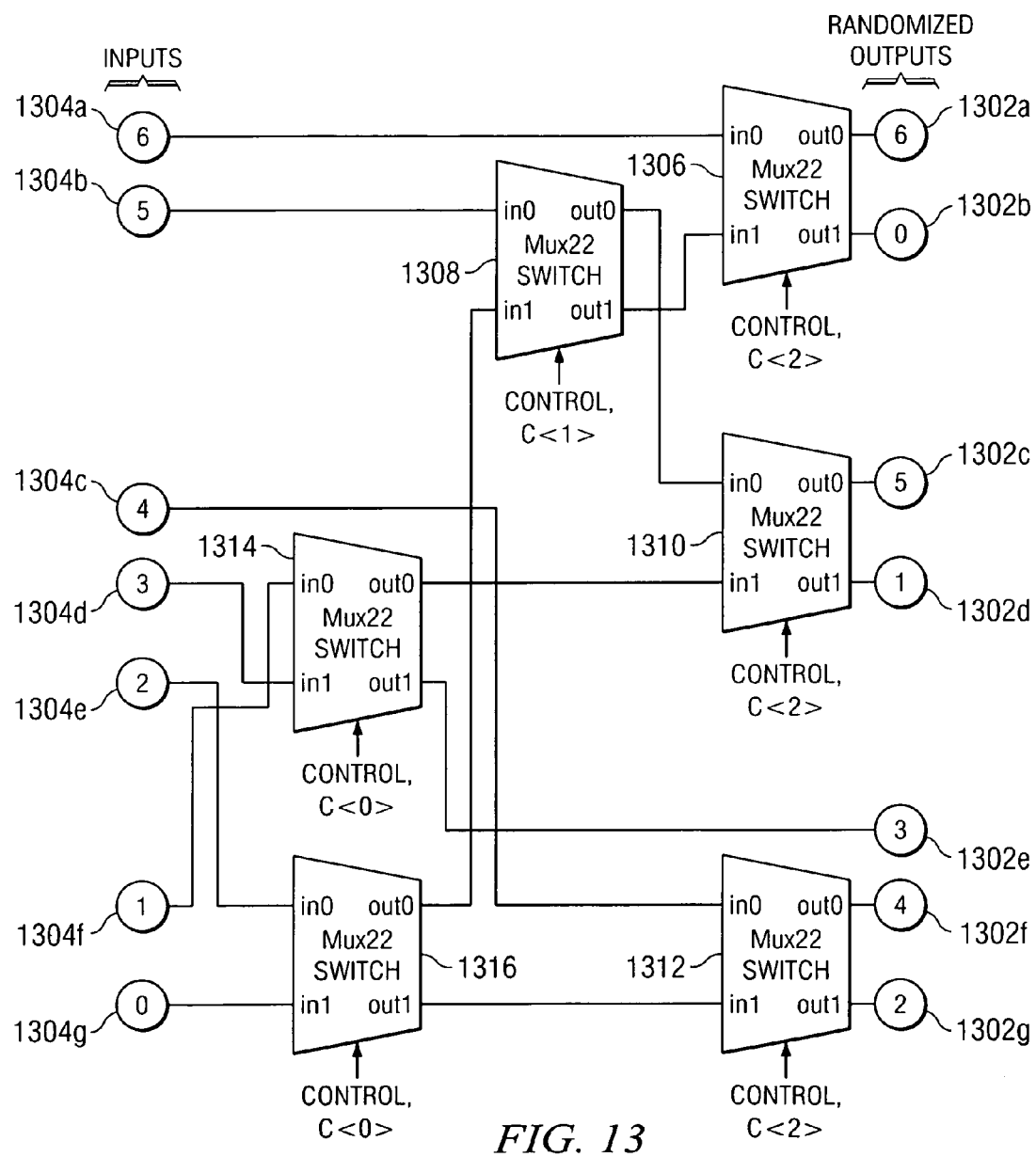
FIG. 13 illustrates a 3-bit partially randomized mux control circuit.

Referring now to FIG. 13, there is illustrated one embodiment for the m-bit randomizer wherein there is configured a partially randomized 3-bit (m=3) mux control circuit for providing randomized outputs 1302 responsive to a 7-bit input 304. Each component within the 3-bit mux control circuit comprises a 2-input 2-output multiplexor switch wherein responsive to a first controlled signal, the in0 input signal is provided at the out0 output, and the in1 input signal is provided at the out1 output. When the control signal is at a second level, the in0 input signal is provided at the out1 output, and the in1 input is provided at the out0 output.

The structure of the randomizer is defined for the embodiment in the following manner. Input 6 1304*a* is provided to the in0 input of multiplexer switch 1306. The out0 output of the multiplexer switch 1306 is connected to the output bit-6 1302*a* and the out1 output of the multiplexer switch 1306 is connected to bit-0 1302*b*. The multiplexer switch 1306 is controlled by the third-bit of the control input m. Control input 5 1304*b* is connected to the in0 input of multiplexer switch 1308. The out0 output of the multiplexer switch 1308 is connected to an in0 input of multiplexer switch 1310. The out1 output of the multiplexer switch 1308 is connected to the in1 input of multiplexer switch 1306. The multiplexer switch 1308 is controlled by the second-bit of the control input m. The out0 output of the multiplexer switch 1310 is connected to the bit-5 output 1302*c*. The out1 output of the multiplexer switch 1310 is connected to the bit-1 output 1302*d*. The multiplexer switch 1310 is controlled by the third-bit of the control input m. The input control signal 1304*c* is connected to the in0 input of multiplexer switch 1312. The out0 output of the multiplexer switch 1312 is connected to output bit-4 1301*f*. The out1 output of the multiplexer switch 1312 is connected to the output bit-2 1302*g*. The multiplexer switch 1312 is controlled by the third-bit of the input control signal m.

The control input 3 1304*d* is connected to the in1 input of multiplexer switch 1314. The out0 output of the multiplexer switch 1314 is connected to the in1 input of multiplexer switch 1310. The out 1 output of multiplexer switch 1314 is connected to the output control bit-3 1302*e*. The multiplexer switch 1314 is controlled by the first bit of the control signal m. Control input 2 1304*e* is connected to the in0 input of multiplexer switch 1316. The out0 output of the multiplexer switch 1316 is connected to the in1 input of multiplexer switch 1308. The out1 output of the multiplexer switch 1316 is connected to the in1 input of multiplexer switch 1312. Multiplexer switch 1316 is controlled by the first bit of the controlled signal m. The input control 1 1304*f* is connected to the in0 input of multiplexer switch 1314. The control input-0 1304*g* is connected to the in1 input of multiplexer switch 1316.

Using the above described randomizer, the various configurations of the capacitors used for a bit within the capacitor array may be selected as the correct unit capacitor grouping is searched for as described in FIG. 9.

Although the preferred embodiment has been described in detail, it should be understood that various changes, substitutions and alterations can be made therein without departing from the scope of the invention as defined by the appended claims.

What is claimed is:

1. A method for selecting capacitors for each bit of a SAR ADC, comprising the steps of:
    (a) selecting a group of capacitors from a capacitor array for each bit of the SAR ADC;
    (b) determining a weight of the selected capacitors for each bit of the SAR ADC;
    (c) determining if the weight determined for the selected capacitors for each bit of the SAR ADC is substantial equal to a desired value;
    (d) associating the selected group of capacitors with the bits of the SAR ADC if the weight is substantially equal to the desired value;
    (e) selecting a next group of capacitors from the capacitive array if the weight does not substantially equal the desired value; and
    (f) repeating steps (b)–(e) for the next group of capacitors until a determined weight equals the desired value.

2. The method of claim 1, wherein the step of determining a weight further comprises the steps of varying an input voltage with respect to a fixed reference voltage to determine a code for the bits of the SAR ADC.

3. The method of claim 1, wherein the step of selecting further comprises:
    generating a first control signal containing a plurality of bits in a first order from control logic of the SAR ADC;
    generating a randomized control signal responsive to the first control signal and a randomizer control signal, the randomized control signal including all of the plurality of bits in a different order; and
    selecting the capacitors from the capacitor array responsive to the randomized control signal.

4. The method of claim 3, wherein the randomized control signal may comprise a plurality of values based upon a value of the randomizer control signal.

5. The method of claim 1, wherein the steps of selecting further comprises:
    generating a first control signal containing n bits in a first order from control logic of the SAR ADC;
    translating the first control signal containing n bits to a second control signal containing $2*(2^{n/2}-1)$ bits;
    generating a randomized control signal responsive to the second control signal and a randomizer control signal, the randomized control signal including the $2*(2^{n/2}-1)$ bits in a different order; and
    selecting the capacitors from the capacitor array for each bit of the SAR ADC responsive to the randomized control signal.

6. The method of claim 5, wherein the randomized control signal may comprise a plurality of values based upon a value of the randomizer control signal.

7. The method of claim 1, further including the step of associating a group of capacitors having the weight closest to the desired value if no weight of a group of capacitors is substantially equal to the desired value.

8. A method for selecting capacitors for each bit of a SAR ADC, comprising the steps of:
    (a) generating a first control signal containing a plurality of bits in a first order from control logic of the SAR ADC;
    (b) generating a randomized control signal responsive to the first control signal and a randomizer control signal, the randomized control signal including all of the plurality of bits in a different order; and
    (c) selecting a first group of the capacitors from a capacitor array for each bit of the SAR ADC responsive to the randomized control signal;
    (d) varying an input voltage with respect to a fixed reference voltage for the bits of the SAR ADC to determine weights of the first group of capacitors;
    (e) determining if the weights of the selected group of capacitors for each bit of the SAR ADC is substantial equal to a desired value;
    (f) associating the selected group of capacitors with the bits of the SAR ADC if the weight is substantially equal to the desired value;
    (g) selecting a next group of capacitors from the capacitive array if the weight does not substantially equal the desired value;
    (h) repeating steps (b)–(g) for the next group of capacitors until a determined weight substantially equals the desired value.

9. The method of claim 8, wherein the randomized control signal may comprise a plurality of values based upon a value of the randomizer control signal.

10. The method of claim 8, wherein the step of generating the first control signal further comprises the step of generating a first control signal containing n bits in a first order from control logic of the SAR ADC.

11. The method of claim 10, wherein the step of translating further comprises the step of translating the first control signal containing n bits to a second control signal containing $2*(2^{n/2}-1)$ bits.

12. The method of claim 11, wherein the step of generating further comprises the step of generating a randomized control signal responsive to the second control signal and a randomizer control signal, the randomized control signal including the $2*(2^{n/2}-1)$ bits in a different order.

13. The method of claim 8, further including the step of associating a group of capacitors having the weight closest to the desired value if no weight of a group of capacitors is substantially equal to the desired value.

14. A circuit for selecting capacitors for each bit of a SAR ADC, comprising:
   a controller configured to:
   (a) select a group of capacitors from a capacitor array for each bit of the SAR ADC responsive to a randomized control signal;
   (b) determine a weight of the selected capacitors for each bit of the SAR ADC;
   (c) determining if the weight determined for the selected capacitors for each bit of the SAR ADC is substantially equal to a desired value;
   (d) associate the selected group of capacitors with the bits of the SAR ADC if the weight is substantially equal to the desired value;
   (e) select a next group of capacitors from the capacitor array if the weight does not substantially equal the desired value;
   (f) repeat steps (b)–(e) for the next group of capacitors until a determined weight equals the desired value; and
   circuitry for creating the randomized control signals.

15. The circuit of claim 14, wherein the circuitry for creating further comprises:
   SAR control logic for generating a first control signal containing a plurality of bits in a first order from control logic of the SAR ADC;
   a translator for generating a randomized control signal responsive to the first control signal and a randomizer control signal, the randomized control signal including all of the plurality of bits in a different order; and
   a randomizer for selecting the capacitors from the capacitor array responsive to the randomized control signal.

16. The circuit of claim 14, wherein the controller is further configured to determine a weight further by varying an input voltage with respect to a fixed reference voltage to determine a code for the bits of the SAR ADC.

17. The circuit of claim 16, wherein the randomized control signal may comprise a plurality of values based upon a value of the randomizer control signal.

18. The circuit of claim 14, wherein the circuitry for creating further comprises:
   SAR control logic for generating a first control signal containing n bits in a first order from control logic of the SAR ADC;
   a translator for translating the first control signal containing n bits to a second control signal containing $2*(2^{n/2}-1)$ bits; and
   a randomizer for generating a randomized control signal responsive to the second control signal and a randomizer control signal, the randomized control signal including the $2*(2^{n/2}-1)$ bits in a different order.

19. The circuit of claim 18, wherein the randomized control signal may comprise a plurality of values based upon a value of the randomizer control signal.

20. The circuit of claim 14, wherein the controller is further configured to associate a group of capacitors having the weight closest to the desired value if no weight of a group of capacitors is substantially equal to the desired value.

* * * * *